US010859639B2

(12) United States Patent
Kasztenny

(10) Patent No.: US 10,859,639 B2
(45) Date of Patent: Dec. 8, 2020

(54) FAULT-TYPE IDENTIFICATION IN AN ELECTRIC POWER DELIVERY SYSTEM USING COMPOSITE SIGNALS

(71) Applicant: Schweitzer Engineering Laboratories, Inc., Pullman, WA (US)

(72) Inventor: Bogdan Z. Kasztenny, Markham (CA)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 113 days.

(21) Appl. No.: 16/404,990

(22) Filed: May 7, 2019

(65) Prior Publication Data

US 2020/0103452 A1    Apr. 2, 2020

Related U.S. Application Data

(60) Provisional application No. 62/740,231, filed on Oct. 2, 2018.

(51) Int. Cl.
*G01R 31/50* (2020.01)
*G01R 25/04* (2006.01)
(Continued)

(52) U.S. Cl.
CPC ............ *G01R 31/50* (2020.01); *G01R 25/04* (2013.01); *H02H 1/0007* (2013.01); *H02H 1/0092* (2013.01); *H02H 7/26* (2013.01)

(58) Field of Classification Search
CPC ........ G01R 31/52; G01R 31/54; G01R 31/58; G01R 31/60; H02H 1/0092; H02H 7/26; H02H 7/261
See application file for complete search history.

(56) References Cited

U.S. PATENT DOCUMENTS 3,488,559 A    1/1970  Souillard
3,626,281 A   12/1971  Souillard
(Continued)

FOREIGN PATENT DOCUMENTS

WO    2007032697    3/2007
WO    2007110004    4/2007
(Continued)

OTHER PUBLICATIONS

J. Blumschein, C. Dzienis, Y. Yelgin, New Design of Distance Protection for Smart Grid Applications, 13th International Conference on Development in Power System Protection, Mar. 7-10, 2016.

(Continued)

*Primary Examiner* — Gary L Laxton
(74) *Attorney, Agent, or Firm* — Richard M. Edge

(57) ABSTRACT

Fault-type identification using composite signals composed from symmetrical component voltages and currents is described herein. Angular differences between negative-sequence composite signals and zero-sequence composite signals are used to determine a single-line-to-ground fault, and the faulted phase. Angular differences between positive sequence voltage and negative-sequence composite signals are used to determine a multiple-line-to-ground fault, and the faulted phases. Negative-sequence composite signals and zero-sequence composite signals are calculated using combinations of negative-sequence currents and voltages and zero-sequence voltages and currents, respectively.

20 Claims, 7 Drawing Sheets

(51) Int. Cl.
*H02H 7/26* (2006.01)
*H02H 1/00* (2006.01)

(56) References Cited

U.S. PATENT DOCUMENTS

| | | | |
|---|---|---|---|
| 4,513,340 | A | 4/1985 | Drain |
| 4,670,811 | A | 6/1987 | Eda |
| 4,704,653 | A | 11/1987 | Li |
| 4,795,983 | A | 1/1989 | Crockett |
| 5,115,226 | A | 5/1992 | Schweitzer |
| 5,140,492 | A | 8/1992 | Schweitzer |
| 5,208,545 | A | 5/1993 | Schweitzer |
| 5,390,067 | A | 2/1995 | Eriksson |
| 5,455,776 | A | 10/1995 | Novosel |
| 5,515,227 | A | 5/1996 | Roberts |
| 5,793,750 | A | 8/1998 | Schweitzer |
| 5,796,258 | A | 8/1998 | Yang |
| 6,008,971 | A | 12/1999 | Duba |
| 6,256,592 | B1 | 7/2001 | Roberts |
| 6,411,865 | B1 | 6/2002 | Qin |
| 6,496,342 | B1 | 12/2002 | Horvath |
| 6,518,767 | B1 | 2/2003 | Roberts |
| 6,525,543 | B1 | 2/2003 | Roberts |
| 6,590,397 | B2 | 7/2003 | Roberts |
| 6,608,742 | B2 | 8/2003 | Schweitzer |
| 6,650,969 | B1 | 11/2003 | Sieleman |
| 6,697,240 | B2 | 2/2004 | Nelson |
| 6,738,719 | B2 | 5/2004 | Stoupis |
| 6,760,670 | B2 | 7/2004 | Stoupis |
| 6,839,210 | B2 | 1/2005 | Roberts |
| 6,904,549 | B2 | 6/2005 | Jurisch |
| 7,345,488 | B2 | 3/2008 | Fischer |
| 7,345,862 | B2 | 3/2008 | Schweitzer |
| 7,355,412 | B1 | 4/2008 | Cannon |
| 7,400,150 | B2 | 7/2008 | Cannon |
| 7,425,778 | B2 | 9/2008 | Labuschagne |
| 7,660,088 | B2 | 2/2010 | Mooney |
| 8,081,002 | B2 | 12/2011 | Wahlroos |
| 8,183,871 | B2 | 5/2012 | Saha |
| 8,410,785 | B2 | 4/2013 | Calero |
| 8,558,551 | B2 | 10/2013 | Mynam |
| 8,791,704 | B2 | 7/2014 | Mynam |
| 8,866,487 | B2 * | 10/2014 | Rostron .................. H02H 3/32 324/522 |
| 8,942,954 | B2 * | 1/2015 | Gong .................. G01R 31/085 702/185 |
| 9,257,827 | B2 | 2/2016 | Calero |
| 9,413,156 | B2 * | 8/2016 | O'Brien ................. H02H 3/422 |
| 9,594,112 | B2 * | 3/2017 | Schweitzer, III .... G01R 31/088 |
| 10,132,853 | B2 * | 11/2018 | Liang .................. G01R 31/086 |
| 2006/0152866 | A1 | 7/2006 | Benmouyal |
| 2007/0035902 | A1 | 2/2007 | Schweitzer |
| 2009/0088989 | A1 | 4/2009 | Guzman-Casillas |
| 2009/0091867 | A1 | 4/2009 | Guzman-Casillas |
| 2012/0053744 | A1 | 3/2012 | Manson |
| 2012/0140365 | A1 | 6/2012 | Labuschagne |
| 2016/0072270 | A1 * | 3/2016 | Rostron ................. H02H 3/081 700/294 |
| 2017/0082675 | A1 * | 3/2017 | Schweitzer, III .... H02H 1/0007 |
| 2017/0356965 | A1 | 12/2017 | Guzman-Casillas |
| 2020/0041562 | A1 * | 2/2020 | Naidu .................. G01R 31/083 |

FOREIGN PATENT DOCUMENTS

| | | |
|---|---|---|
| WO | 2009010169 | 1/2009 |
| WO | 2009136975 | 11/2009 |
| WO | 2010006652 | 1/2010 |
| WO | 2010148570 | 12/2010 |

OTHER PUBLICATIONS

Bogdan Kasztenny, Bruce Campbell, Jeff Mazereeuw, Phase Selection for Single-Pole Tripping-Weak Infeed Conditions and Cross-Country Faults, Oct. 24-26, 2000.

Karl Zimmerman, David Costello, Fundamentals and Improvements for Directional Relays, Mar. 2010.

Edmund O. Schweitzer, III, New Developments in Distance Relay Polarization and Fault Type Selection, Spokane, WA, Oct. 1989.

Daqing Hou, Normann Fischer, Deterministic High-Impedance Fault Detection and Phase Selection on Ungrounded Distribution Systems, Sep. 2005.

David Costello, Karl Zimmerman, Determining the Faulted Phase, Jul. 2010.

David Costello, Karl Zimmerman, Effect of Zone 3 Settings on Fault Type Selection in SEL-121F, SEL-121S, SEL-121-0, SEL-221F, SEL-221S, and SEL-221-16 Relays, Sep. 2009.

Karl Zimmerman, David Costello, Impedance-Based Fault Location Experience, Aug. 2005.

Demitrios Tziouvaras, Jeff Roberts, Gabriel Benmouyal, New Multi-Ended Fault Location Design for Two- or Three-Terminal Lines, Nov. 2004.

* cited by examiner

FAULT-TYPE IDENTIFICATION IN AN ELECTRIC POWER DELIVERY SYSTEM USING COMPOSITE SIGNALS

RELATED APPLICATION

This application claims benefit under 35 U.S.C. § 119(e) to U.S. provisional application Ser. No. 62/740,231 filed on 2 Oct. 2018 titled "Fault-Type Identification Using Symmetrical Component Voltages and Currents" naming Bogdan Z. Kasztenny as inventor, which is incorporated herein by reference in its entirety.

TECHNICAL FIELD

This disclosure relates to fault type identification in electric power delivery systems. More particularly, this disclosure relates to fault type identification in protective relaying applications under adverse conditions using composite signals from symmetrical components of power system voltages and currents.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
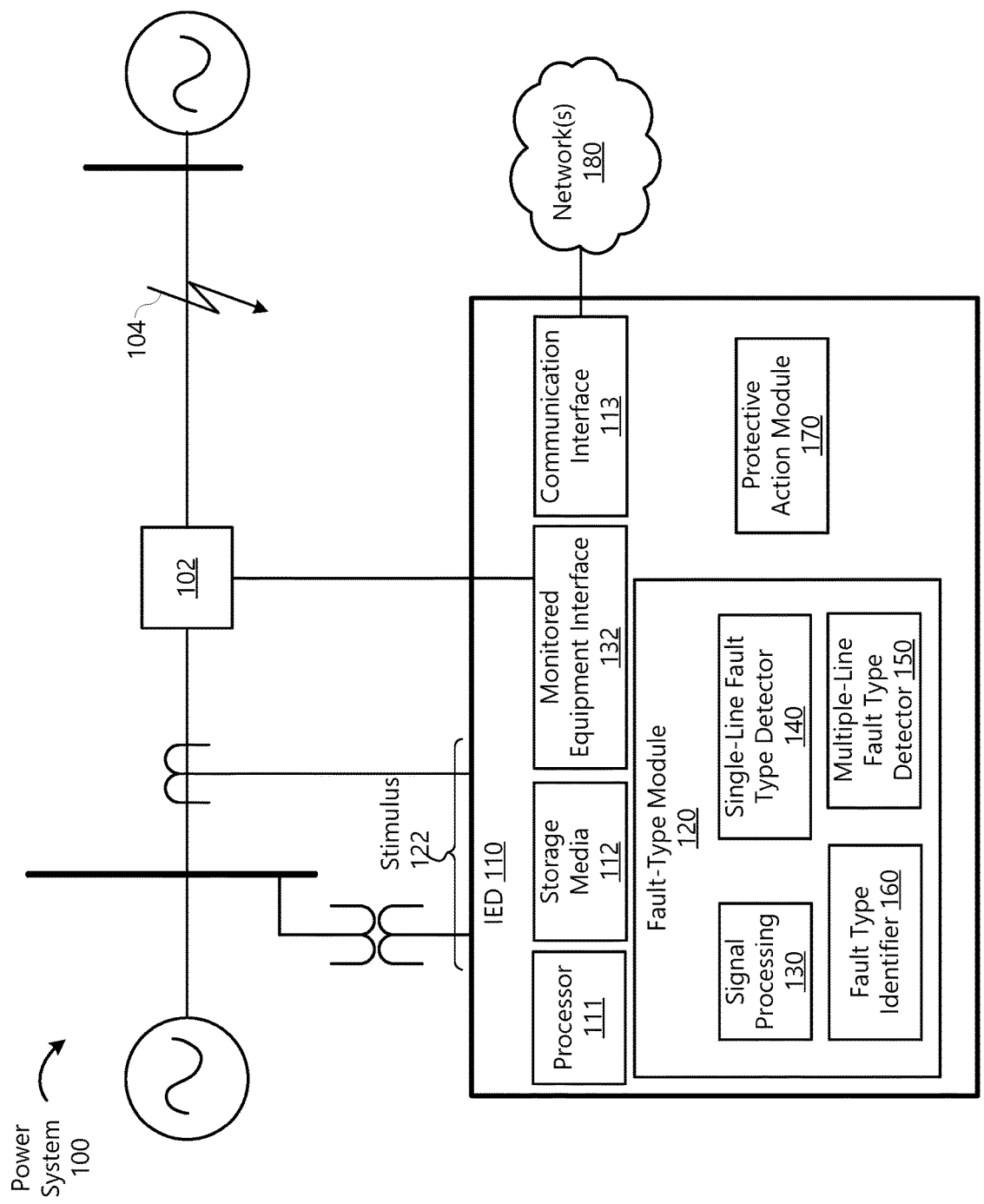
FIG. 1 illustrates a one-line diagram of an electrical power delivery system comprising an Intelligent Electronic Device (IED) implementing monitoring and protection functions for the power system.

This disclosure relates to identifying the type of fault (short-circuit) in an alternating current power system, for the application of supervising certain protection elements to ensure their correct operation, for initiating a phase-selective trip command in single pole tripping applications, for selecting the right measurement loop in impedance-based fault locators, and for assisting the operators in inspecting and restoring a transmission line after a fault.

Alternate current power systems are three-phase (three-conductor) systems with a voltage present across all combinations of conductors, and ground. We denote the conductors as A, B and C. A short-circuit is an insulation breakdown between any two conductors, or a conductor and the ground. Ten types of faults are therefore possible, including single-line-to ground, line-to-line, line-to-line-to-ground, and three-phase faults: A to ground (AG), B to ground (BG), C to ground (CG), A to B (AB), B to C (BC), C to A (CA), A to B to ground (ABG), B to C to ground BCG, C to A to ground CAG, and a three-phase fault with or without ground (3P or ABC).

Various protection elements are in use to protect against faults. Some of these elements, especially distance protection elements, require fault type identification to work correctly or optimally. For example, during an AG fault, the AG distance loop should be allowed to operate, and other loops should be inhibited, especially the AB and CA loops which see a lower voltage because of the VA voltage being depressed by the AG fault. Similarly, during an AB fault the AB loop should be allowed to operate, but not the BC and CA loops which see a lower voltage because of the VA and VB voltages being depressed by the AB fault.

Some other protection elements or schemes, such as a permissive overreaching transfer scheme with negative-sequence directional elements, detect faults very reliably, even high-resistance faults, but cannot inherently identify the fault type. These schemes require fault type identification logic if used for single pole tripping.

Single-pole tripping schemes work with circuit breakers that have three individual open/close mechanisms, and initiate a single-pole (single-phase) trip for single-line to ground faults, and a three-pole trip for multi-phase faults. For example, for an AG fault a single-pole tripping scheme operates only the pole A of the breaker. This action removes the fault current (on phase A), but keeps the other two conductors (phases B and C) in service allowing the line to transmit considerable fraction of the pre-fault power. Subsequently, counting on the fault to self-extinguish which is the case in large percentage of cases, the scheme closes the pole A restoring the line to normal operation. To correctly select the right pole of the breaker for tripping, a single-pole tripping scheme requires to identify the fault type. Some protection elements are phase selective and provide the fault type identification. Others such as the negative-sequence elements are not phase selecting and they require a separate fault type identification logic.

Fault type identification is also used in impedance-based fault locating methods to select the right loop for the fault locating calculations (similarly to the distance protection elements).

Fault type identification may also be used to signal to the system operators (utility personnel) the fault type to aid decision-making regarding line inspection, repairs, and putting the line manually back into service after a fault. Typically, a protective device signals the fault type to the system operators using a communications protocol, a fault record, or front-panel visual indicators (targets).

A faulted phase typically draws an elevated current and shows a depressed voltage. Such crude symptoms of a fault allow fault type identification but only in very clear cases such as when the fault current is much higher than the load current, when the voltage is considerably depressed because the fault resistance is low, and when there is no standing unbalance in the system such as due to unbalanced loads or open phase conditions. In clear cases, an angle between zero-sequence current (I0) and negative-sequence current (I2) can be used to determine which phase is involved in a single-line-to-ground fault, i.e. whether the fault is AG, BG, or CG, depending on the rotation convention and the phase to which the negative-sequence current is referenced.

Assuming the negative-sequence current is calculated with reference to phase A which is typically the case, and the system phase rotation is ABC, then if the angle between the I2 and I0 is about 0°, then the fault is an AG fault; if the angle is about +120°, then the fault is a BG fault; and if the angle is about −120°, then the fault is a CG fault.

Three-phase power systems can be operated with a phase rotation ABC or ACB. In the ABC phase rotation convention, the conductors are connected to a three-phase source in such a manner that phase A reaches the positive peak first, phase B next, and phase C last, and the pattern repeats itself. In the ACB phase rotation convention, the conductors are connected to a three-phase source in such a manner that phase A reaches the positive peak first, phase C next, and phase B last, and the pattern repeats itself.

The above rule of identifying a SLG fault is valid for ABC phase rotation. In ACB systems if the angle between I2 and I0 is +120°, the fault is CG, and if the angle between I2 and I0 is −120°, the fault is BG. In other words, phase B and C are swapped. In this document, we describe fault type identification for ABC systems. Any logic that works for ABC systems can be adapted to work on ACB systems by swapping the B and C indices in the output indicators from the fault type identification logic applicable to the ABC systems.

Let us go back to the basic I2 vs. I0 principle. Strictly speaking, the angle of 0° indicates that phase A is different than the other two phases. In other words, phase A is faulted and the other two phases are healthy (AG fault); or phase A is healthy and the other two phases are faulted (BCG fault). Therefore, the basic I2 vs. I0 method can distinguish only between these three groups of fault types, namely: (AG or BCG) versus (BG or CAG) versus (CG or ABG).

Furthermore, the angle between zero-sequence current and negative-sequence current may not reliable under high-resistance faults if the I2 and/or I0 values are very small; under symmetrical three-phase faults; during CT saturation; during weak infeed conditions; during standing pre-fault negative-sequence current or zero-sequence current, and the like.

Accordingly, what is needed is a fault-type identification solution that properly identifies the fault type in a variety of fault and pre-fault conditions, including at least those non-ideal conditions discussed.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Several aspects of the embodiments described may be implemented as software modules or components or elements. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions. Software modules or components may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment.

FIG. 1 illustrates a one-line diagram of an electric power delivery system 100 monitored by an IED 110 that provides electric power system protection upon proper fault type identification in accordance with several embodiments herein. As discussed above, the IED 110 may comprise and/or be implemented in conjunction with a computing device. Accordingly, the IED 110 may include a processor 111, which may comprise one or more general purpose processors, special purposes processors, application-specific integrated circuits, programmable logic elements (e.g., FPGAs), or the like. The IED 110 may further comprise non-transitory machine-readable storage media 112, which may include one or more disks, solid-state storage (e.g., Flash memory), optical media, or the like. The IED 110 may be communicatively coupled to one or more networks 180 via one or more communication interfaces 113. The networks 180 may include special-purpose networks for monitoring and/or controlling the electrical power system 100 (e.g., SCADA networks, or the like). The networks 180 may further include general purpose communication networks, such as a TCP/IP network, or the like. The communication interface 113 may include wired and/or wireless communication interfaces (e.g., serial ports, RJ-45, IEEE 802.11 wireless network transceivers, etc.). In some embodiments, the IED 110 may include human-machine interface (HMI) components (not shown), such as a display, input devices, and so on.

The IED 110 may include a plurality of protection and monitoring elements such as a fault-type module 120 that may be embodied as instructions stored on computer-readable media (such as storage media 112) that, when executed on the processor 111, cause the IED to determine a fault type. Upon determining a fault type, the instructions may cause the IED to take actions such as protective actions (signaling a circuit breaker to open the appropriate phases), displaying fault type information, sending messages including the fault type information, and the like.

The fault-type module may include instructions for signal processing 130, single-line fault type detector 140, and a multiple-line fault type detector 150, and a fault-type identifier 160. Upon detection of fault 104, the fault type module determines the fault type from among the different available fault types using the embodiments described in more detail herein. The storage media 112 may include instructions to cause the IED to signal a circuit breaker 102 to open, removing electric power from being fed to the fault upon detecting the fault and the fault type.

The IED 110 may obtain electrical signals from the power system 100 through current transformers and voltage transformers, i.e. it may receive stimulus 122 from the power system 100. The stimulus 122 may be received directly via the measurement devices described above and/or indirectly via the communication interface 113 (e.g., from another IED or other monitoring device (not shown) in the electrical power system 100). The stimulus 122 may include, but is not limited to: current measurements, voltage measurements, and the like.

Furthermore, the IED 110 may include a monitored equipment interface 132 in electrical communication with monitored equipment. As illustrated, the monitored equipment interface 132 is in communication with circuit breaker 102. Circuit breaker 102 may be configured to selectively trip or open by phase, effecting a single-phase trip or a multiple-phase trip. The monitored equipment interface 132 may include hardware for providing a signal to the circuit breaker 102 to open and/or close in response to a command from the IED 110. For example, upon detection of a fault and the fault type, the protective action module 170 may determine a protective action and effect the protective action on the power system by, for example, signaling the monitored equipment interface 132 to provide an open signal to the appropriate circuit breaker 102. In certain embodiments, the protective action may be effected by additional or separate devices. For example, upon determination of the fault type, the IED 110 may signal other devices (using, for example, the network 180, or signaling another device directly) regarding the fault, which other devices may signal a breaker to open, thus effecting the protective action on the electric power delivery system. The protective action module may use the fault type determination to determine a line to open, in its distance protection elements, in determining an appropriate phase loop to use or inhibit in distance protection elements, and the like.

The signals obtained from the electric power delivery system may be used to calculate voltage and current signals for use by the fault-type module. Line currents and voltages may be sampled at a rate suitable for protection, such as in the order of kHz. The samples may be aligned with a time input (not shown) in some embodiments. An analog-to-digital converter (ADC) may create digital representations of the incoming line current and voltage measurements. The output of the ADC may be used in various embodiments herein. As described above, these voltage and current signals may be used to calculate the symmetrical components as described in more detail herein.

A fault type may be determined using composite signals calculated using symmetrical components. Different composite signals are used depending on system conditions such as availability of currents only or currents and voltages. Furthermore, the negative-sequence voltage contributor to the composite signals may be boosted using coefficients. Angles between the composite signals are used to determine preliminary single-line-to-ground fault types and multiple-line-to-ground fault types. The preliminary fault types are then used to determine the fault type based on the particular combination of preliminary fault types. Thus, at a high level, embodiments herein comprise improvements over the use of negative-sequence current (I2) vs zero-sequence current (I0) and positive-sequence voltage (V1) vs negative-sequence current (I2) principles. Using symmetrical components, the method does not use any incremental quantities and therefore is not negatively impacted by frequency excursions and can be kept operational long into a fault, supervising time-delayed protection elements.

Instead of using I2 and I0, embodiments herein combine I2 with V2, and I0 with V0 to form composite signals. The embodiments generally use a negative-sequence composite signal (S2) in place of the I2 current; and a zero-sequence composite signal (S0) in place of the I0 current. Equations 1a-1e may be used to obtain the S2 and S0 composite signals and the fault direction (FDIR) signal:

If $LOP$ then $S2=I2Z, S0=I0Z, FDIR=N/A$     Eq. 1a

Else:

$S2F=I2Z-H2 \cdot V2$     Eq. 1b $S2R=I2Z+H2 \cdot V2$     Eq. 1c

If $|S2F| \geq |S2R|$ Then $S2=S2F, S0=I0Z-H0 \cdot V0$, $FDIR=+1$     Eq. 1d

Else $S2=S2R, S0=I0Z+H0 \cdot V0, FDIR=-1$     Eq. 1e where:

I2Z is the I2 current shifted by the line impedance angle, $I2Z=I2 \cdot 1 \angle Z1ANG$.

I0Z is the I2 current shifted by the line impedance angle, $I0Z=I0 \cdot 1 \angle Z1ANG$.

Z1ANG is the line-impedance angle;

FDIR is a fault direction indicator of +1 for forward, and −1 for reverse faults;

H2 and H0 are boost parameters; and,

LOP is the loss of potential indication.

It should be noted that the LOP condition may be determined using the voltage and/or current signals and produced using existing LOP logic of the IED. Similarly, it should be noted that phasors of voltage and currents can be obtained from raw voltage and current signals with a number of methods, such as cosine filtering, Fourier filtering, etc. Likewise, the FDIR signal can be also obtained with any known directional element logic, including negative-sequence or zero-sequence directional elements.

When the voltage (V2 and V0) is very low, such as when the system behind the relay is very strong, the S2 and S0 signals are effectively the negative- and zero-sequence currents. When the voltage is high such as when the system behind the relay is very weak, then the currents are boosted by the voltages to increase the S2 and S0 composite signals. Under weak infeed conditions the currents can be small, but the voltages may be significant. Similarity, a non-standard source can output very low currents with a time-varying angle in the negative-sequence current, but the V2 and V0 voltages will be significant in that case. Several embodiments use a voltage boost (H2 and H0), resulting in the S2 and S0 signals being higher and less impacted by the time-varying angles of the currents from non-standard sources. Also, the S2 and S0 signals are less impacted by CT errors including saturation, or general measurement errors if the currents are very low. Accordingly, the embodiments herein are an improvement to fault-type identification by using composite signals S2 and S0 that are less impacted by many of the conditions that may exist in electric power delivery systems.

The negative-sequence voltage signals are either subtracted (forward faults) or added (reverse faults) so that the net effect is to the boost in the composite signal level compared with the voltage and current signals taken separately. Embodiments herein use Equations 1b, 1c, and 1d to sort out the fault direction, and whether "+" or "−" sign in the S2 and S0 calculations are to be used. The FDIR variable captures the sign for downstream usage. S2F is used for forward faults (FDIR=+1) and S2R is used for reverse faults (FDIR=−1). Under the LOP condition the FDIR variable is not determined but will not be needed in the downstream calculations either.

The sequence voltages at the fault location for forward faults may be calculated using Equations 2a and 2b:

$V2F=V2-Z2 \cdot I2Z$     Eq. 2a $V0F=V0-Z0 \cdot I0Z$     Eq. 2b where:

Z2 is the negative-sequence impedance between the relay location and the fault; and Z0 is the zero-sequence impedance between the relay location and the fault.

The sequence voltages can be small at the IED location (V2, V0) but are at their maximum values at the fault location (V2F, V0F). Therefore, these voltages allow better understanding of the fault compared with either currents or voltages at the IED location. However, to use Equations 2a or 2b the fault location must be known. And typically, the fault location is determined using the fault type. To break this codependence, embodiments herein use arbitrary Z2 and Z0 values.

A comparison of S2F (one of the method's operating signals) and V2F (true voltage at the fault location) and illustrates that:

$$Z2 \cdot S2F = -V2F, \text{ if } H2=1/Z2 \quad \text{Eq. 3a}$$

Similarly:

$$Z0 \cdot S0F = -V0F, \text{ if } H0=1/Z0 \quad \text{Eq. 3b}$$

In other words, if we selected H2=1/Z2 and H0=1/Z0 the S2F and S0F signals would be exactly proportional to the true voltage at the forward fault location. Because the angle between the S2 and S0 are to be compared, the minus sign in Equations 3a and 3b is not consequential. With the right H2, the S2 signal is proportional to the V2 at the fault location (V2F), and with the right H0 the S0 signal is proportional to V0 at the fault location (V0F). If so, use of the S2 and S0 signals to determine a fault type may be an improvement over the use of the I2 and I0 or V2 and V0 at the IED location, even if the H coefficients are fixed and they do not depend on the fault location.

Negative- and zero-sequence voltages for a reverse fault may be represented by Equations 4a and 4b:

$$V2F = V2 + Z2 \cdot I2Z \quad \text{Eq. 4a}$$

$$V0F = V0 + Z0 \cdot I0Z \quad \text{Eq. 4b}$$

Because the method does not know if the fault is forward or reverse, embodiments herein detect the fault direction by comparing the S2F and S2R magnitudes per Equation 1d, and use the sum or the difference when creating the S2 and S0 composite signals.

In certain embodiments, arbitrary voltage boost values of H2 and H0 may be used to avoid iterations as follows. A fault type is assumed, the fault location is obtained based on the assumed fault type, the Z2 and Z0 corresponding to that location are used, the S2 and S0 signals are calculated. The fault type may then be calculated, and the initial fault type assumption may be confirmed. It is understood however, that according to one embodiment, such an iterative implementation may be applied. Use of boost coefficients—even if arbitrary, i.e. fixed H2 and H0 coefficients—provides improvements over previous fault-type identification systems. For example, in weak systems, the S2 and S0 signals are sufficiently large to accurately determine a fault type, even if the I2 and I0 currents are small. Further, when the I2 and I0 currents are small and exhibit some errors, the boosted signals are larger and therefore have smaller angle errors. If a non-standard source is connected nearby, the I2 current can be small and its angle can be unreliable, however the V2 voltage will be larger and the composite signal (S2) will behave considerably better than the I2 signal alone. Finally, current vs. voltage selection logic is not required using this embodiment. The current and voltage are combined into a single reliable operating signal using the composite signals.

Having the composite signals, embodiments herein may calculate the angle between these composite signals to determine a single-line-to-ground angle SLGANG using Equation 5:

$$SLGANG = \text{angle}\left(\frac{S0}{S2}\right) = \text{angle}(S0) - \text{angle}(S2) \quad \text{Eq. 5}$$

Figure 2:
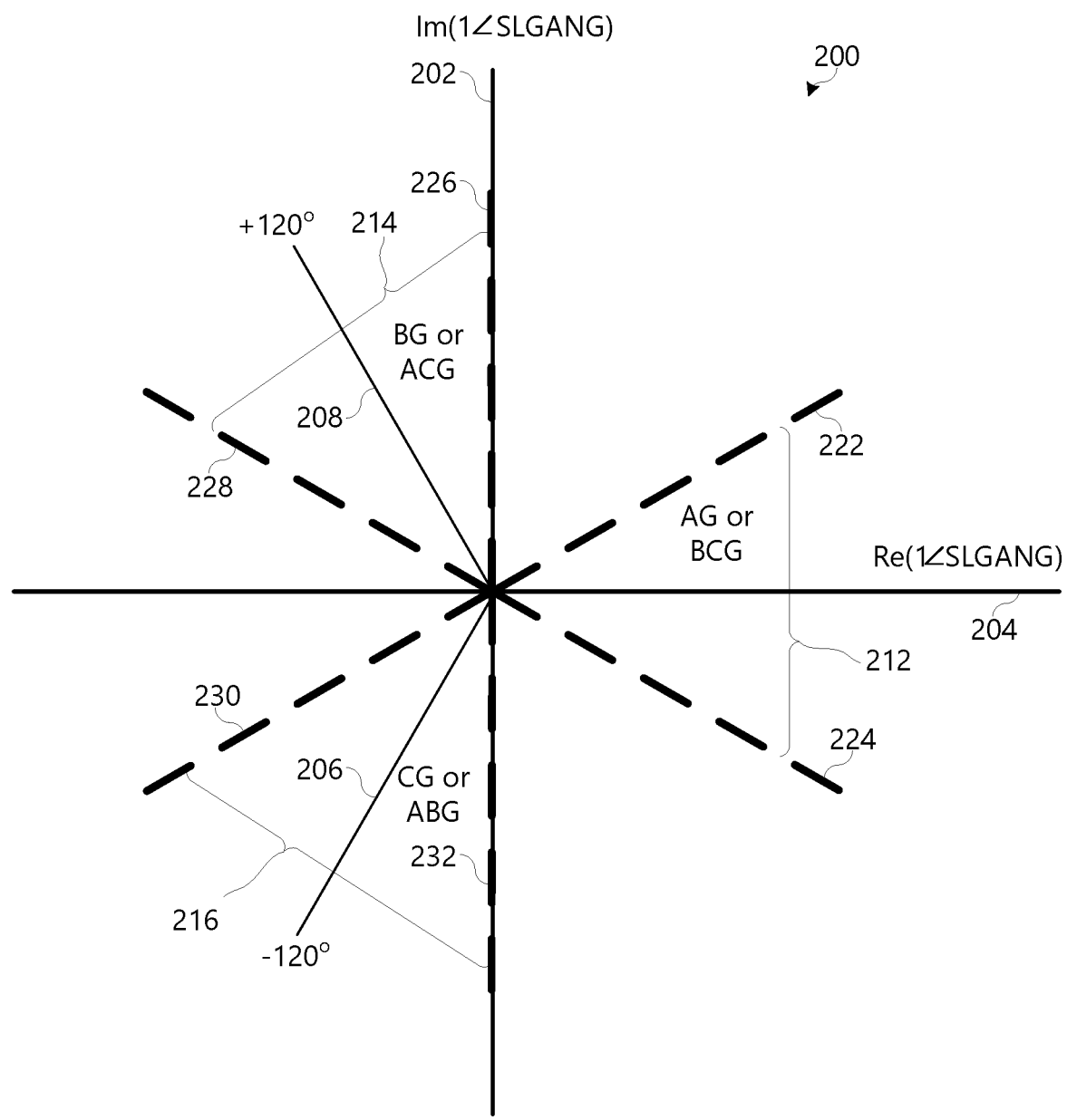
FIG. 2 illustrates a plot of sectors of a certain angle to distinguish single-line-to-ground fault types.

The SLGANG may be used to distinguish between single-line-to-ground faults AG, BG and CG, and may be performed, for example, by the single-line fault type detector 140. Generally, SLGANG may be compared against predetermined angles related to different fault types. For an ABC phase rotation, an angle of around 0° may relate to AG faults or BCG faults; an angle of around +120° may relate to BG or CAG faults; and an angle of around -120° may relate to CG or ABG faults. Limits may be set around each of the angles to create a sector related to each pair of fault types. FIG. 2 illustrates a plot 200 of sectors of SLGANG useful for determining a preliminary fault type. The illustrated plot 200 is valid for the ABC phase rotation, but embodiments may also be used with the ACB phase rotation by swapping the positions for the B and C phases. The illustrated plot 200 includes axis consisting of the real part of the 1∠SLGANG on the horizontal axis and the imaginary part of the 1∠SLGANG on the vertical axis. Three sectors 212, 214, and 216 are used to preliminarily determine a particular single-line-to-ground fault or phase-to-phase-to ground fault. The three sectors 212, 214, and 216 are defined by a central angle and limits. The AG or BCG sector 212 is centered at 0°, and defined by limits 222 at around 30° and 224 at around -30°. The BG or CAG sector 214 is centered at +120° and defined by limits 228 at around 150° and 226 at around 90°. The CG or ABG sector 216 is centered at -120° and defined by limits 230 at around -150° and 232 at around -90°. As illustrated, a limit angle of each sector is about 30° to either side of the center of each sector. In various embodiments, the limit angle may be from around 10° to around 60°. The preliminary single-line-to-ground SLG-AG fault type is determined when the 1∠SLGANG falls within sector 212, and is indicative of AG or BCG faults. The preliminary single-line-to-ground SLG-BG fault type is determined when the 1∠SLGANG falls within sector 214, and is indicative of BG or CAG faults. The preliminary single-line-to-ground SLG-CG fault type is determined when the 1∠SLGANG is within sector 216, and is indicative of CG or ABG faults. The embodiments herein may resolve the fault type (AG or BCG; BG or CAG; CG or ABG) as described below.

Figure 3:
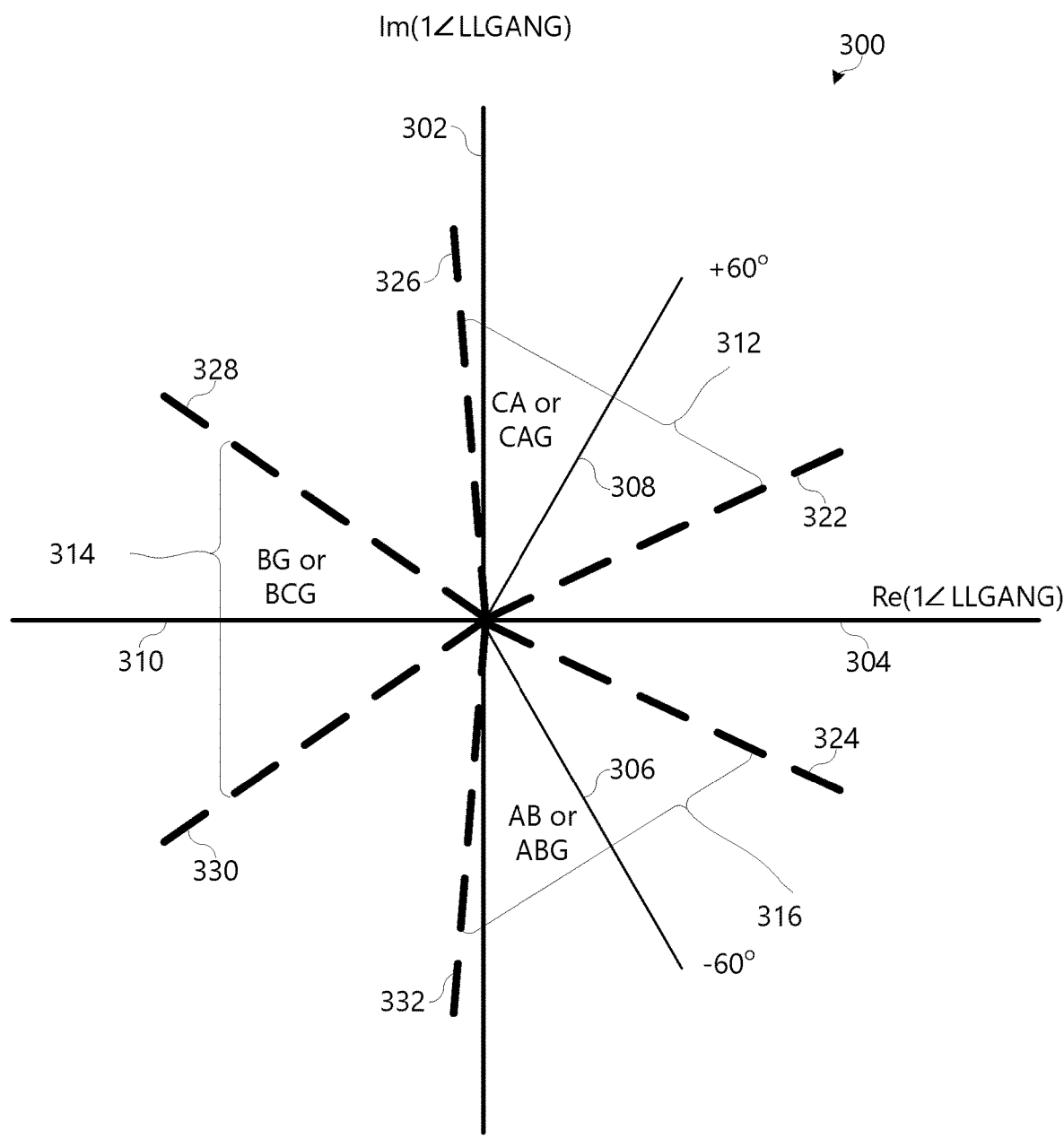
FIG. 3 illustrates a plot of sectors of a certain angle to distinguish multiple-line fault types.

The embodiments described herein for resolving the fault type are an improvement over the use of V1 and I2. As shown in Equation 6, the embodiments herein factor in negative-sequence voltage V2 through use of the negative-sequence composite signal S2:

$$LLGANG = \text{angle}\left(\frac{FDIR \cdot V1}{S2}\right) + 45° - Z1ANG = \quad \text{Eq. 6}$$
$$\ldots \text{angle}(FDIR \cdot V1) - \text{angle}(S2) + 45° - Z1ANG$$

where:
V1 is the positive sequence voltage.
Z1ANG is the angle of the positive-sequence line impedance.
The LLGANG is the line-to-line-to-ground angle.
The angle between V1 and S2 (or I2Z) is normally between 0 deg (for faults without resistance) and 90 deg (for faults with large resistance). The 45 deg constant in equation 6 is the midpoint between the 0 deg and 90 deg bounds. The FDIR multiplier controls if +V1 or −V1 signal is used in equation 6 to account for forward and reverse faults. The LLGANG is compared against predetermined angles related to different fault types, and may be performed in the multiple-line fault type detector 150. For an ABC phase rotation and FDIR=1, an angle of around +60° may relate to forward CAG faults or CA faults or a reverse BG fault; an angle of around +180° may relate to forward BCG faults or BC faults or a reverse AG fault; and an angle of around −60° may relate to forward ABG faults or AB faults or a reverse CG fault. Using the FDIR sign-controlling multiplier resolves the forward phase-to-phase faults and reverse single-line-to-ground faults. Limits may be set around each of the angles to create a sector related to each fault type. FIG. 3 illustrates a plot 300 of the three sectors for determining a line-to-line-to-ground fault type using 1∠LLGANG. The illustrated plot 300 is valid for the ABC phase rotation, but embodiments may also be used with the ACB phase rotation by swapping the positions for the B and C phases. The illustrated plot 300 includes axis consisting of the real part of the 1∠LLGANG on the horizontal axis and the imaginary part of the 1∠LLGANG on the vertical axis. Three sectors 312, 314, and 316 are used to preliminarily determine the phases involved in a phase-to-phase fault or a phase-to-phase-to-ground fault. The three sectors 312, 314, and 316 are defined by a central angle and limits. The CA or CAG sector 312 is centered at an angle of around +60° and bound by limits 326 at around 110° and 322 at around 10°. The BC or BCG sector 314 is centered at an angle of around 180° and bound by limits 328 at around 130° and 330 at around 230°. The AB or ABG sector 316 is centered at around −60° and bound by limits 332 at around −110° and 324 at around −10°. As illustrated, a limit angle of each sector is around 50° to either side of the center of each sector. In various embodiments, the limit angle may be from around 10° to around 90°.

Generally, a preliminary single-line-to-ground fault type may be determined using composite signals from Equation 5. That is, for the AG, BG and CG faults, the SLGANG is going to be about 0°, +120°, and −120° respectively (ABC phase rotation); or 0 20, −120°, and +120°, respectively, for the ACB phase rotation. It should be noted that SLGANG should be about 0° for the BCG fault. The SLGANG value allows separating these three classes of faults: (AG or BCG) from (BG or CAG) from (CG or ABG). The SLGANG angle works for both forward and reverse faults because the I2 and I0 change direction simultaneously in most cases and have coherent direction for all internal faults.

Further, for the AG fault, the LLGANG from Equation 6 should be about 0° for a forward fault and −180° for a reverse fault. For the BCG fault, the LLGANG is going to be −180° for a forward fault and about 0° for a reverse fault. Assuming a fault direction is known, the margin between the AG and BCG fault is very large and the LLGANG can be used to differentiate between the AG and BCG faults. However, note that the difference is 0° between a forward AG fault and a reverse BCG fault. Therefore, the logic needs the FDIR variable when calculating the LLGANG. Other solutions can be used in place of the FDIR. For example, one may calculate the m-values from voltages and currents and select AG or BCG fault depending on which m-value (mAG or m BC) is smaller. In yet another version one may apply both the LLGANG logic (FIG. 3) and the m-value logic together.

Using the preliminary single-line-to-ground fault indication and the preliminary line-to-line-to-ground indicator together allows sorting out the fault type, including between single-line-to-ground and line-to-line-to-ground faults.

Embodiments herein use the preliminary single-line-to-ground fault indications SLG-AG, SLG-BG, SLG-CG, and the preliminary line-to-line-to-ground fault indications LLG-AB, LLG-BC and LLG-CA to identify the fault type. The presence of ground fault current may is used to distinguish fault types with and without ground as illustrated in Table 1. Because ground faults draw zero-sequence current I0, the presence of I0 may be the ground fault current signal. Table 1 shows the general principle used to distinguish between fault types using the preliminary fault type indications and presence of ground fault current:

TABLE 1

Fault Type Identification Logic (1 = asserted, 0 = deasserted)

| Fault Type | SLG-AG | SLG-BG | SLG-CG | LLG-AB | LLG-BC | LLG-CA | Ground Fault Current |
|---|---|---|---|---|---|---|---|
| AG | 1 | | | | 0 | | 1 |
| BG | | 1 | | | | 0 | 1 |
| CG | | | 1 | 0 | | | 1 |
| AB | | | | 1 | | | 0 |
| ABG | | | 1 | 1 | | | 1 |
| BC | | | | | 1 | | 0 |
| BCG | 1 | | | | 1 | | 1 |
| CA | | | | | | 1 | 0 |
| CAG | | 1 | | | | 1 | 1 |
| 3P | =none of the other fault types selected | | | | | | |

Figure 4:
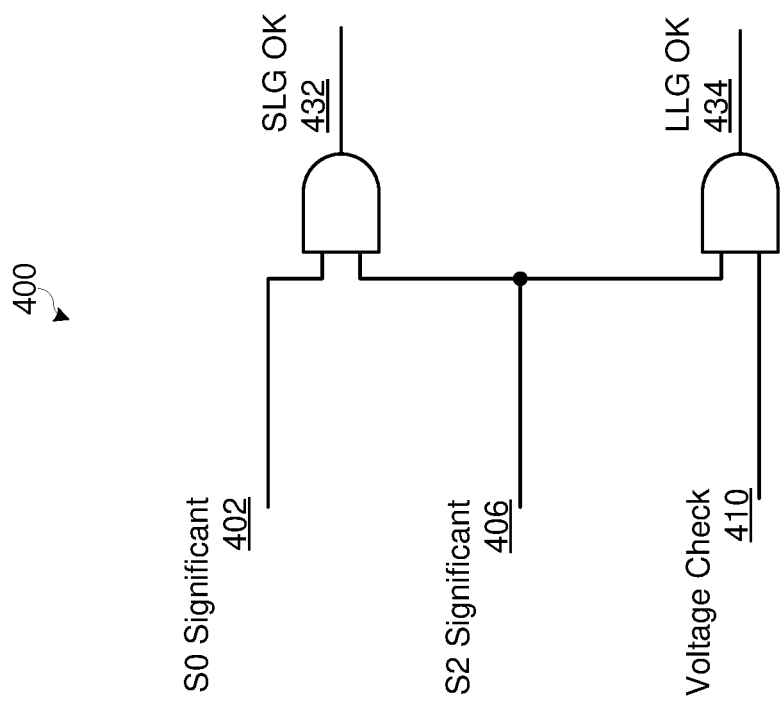
FIG. 4 illustrates a logic for supervising the use of angles to distinguish single-line-to-ground and multi-line fault types.

FIG. 4 illustrates simplified logic that may be used to provide supervisory signals that may be used to enable SLG and LLG fault determination. The supervisory signals ensure that all the signals used to derive the SLGANG are valid (SLG OK), and all the signals used to derive the LLGANG are valid (LLG OK). The SLG OK signal 432 may be asserted when the S0 signal is significant 402 and the S2 signal is significant 406. Sufficiency of these signals may be used to validate that the determined SLG (402 and 406) and LLG (406) angles are valid. The S2 signal may be determined significant (406) when checked for magnitude to verify that it is a reliable signal. Such check may include an absolute level check against the nominal current, and a relative check (cross-check) with respect to the zero- and positive-sequence currents. The S0 may be determined significant (402) when checked for magnitude to verify that it is a reliable signal. Such check may include an absolute level check against the nominal current, and a relative check with respect to the negative- and positive-sequence currents. The LLG OK signal 434 may be asserted when the S2 signal is significant 406 and a voltage check signal 410 is asserted. The voltage check may include, for example, a determination that the V1 signal is more than a threshold (which may be calculated using nominal voltage). The voltage check may also include a determination that an LOP signal is not present. The LOP may be determined using any known method.

Figure 5:
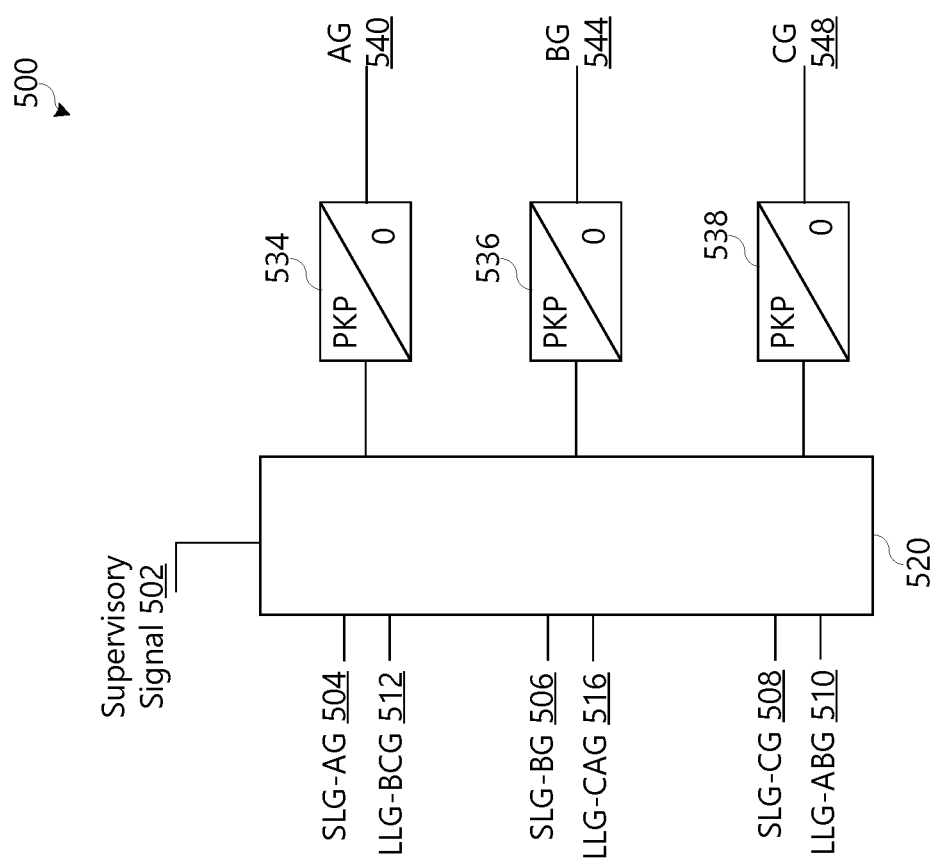
FIG. 5 illustrates a conditioning logic for single-line-to-ground fault type identification.

FIG. 5 illustrates simplified logic 500 that may be useful for determining a single-line-to-ground fault using the preliminary fault signals SLG-AG 504, SLG-BG 506, SLG-CG 508, LLG-BCG 512, LLG-CAG 516, and LLG-ABG 510. The logic may use a supervisory signal 502 to enable SLG fault-type identification block 520. The supervisory signal may include an S2 signal check and/or an S0 signal check as illustrated in FIG. 4. In some embodiments, the supervisory signal 502 is the SLG OK signal 432. Block 520 may be enabled using the supervisory signal 502, and declare SLG faults AG 540, BG 544, and CG 548 according to Table 1. To add further security, pickup timers 534, 536, and 538 may be used to ensure proper operation under transient conditions. The pickup time may be relatively short such as on the order of 2 ms.

Figure 6:
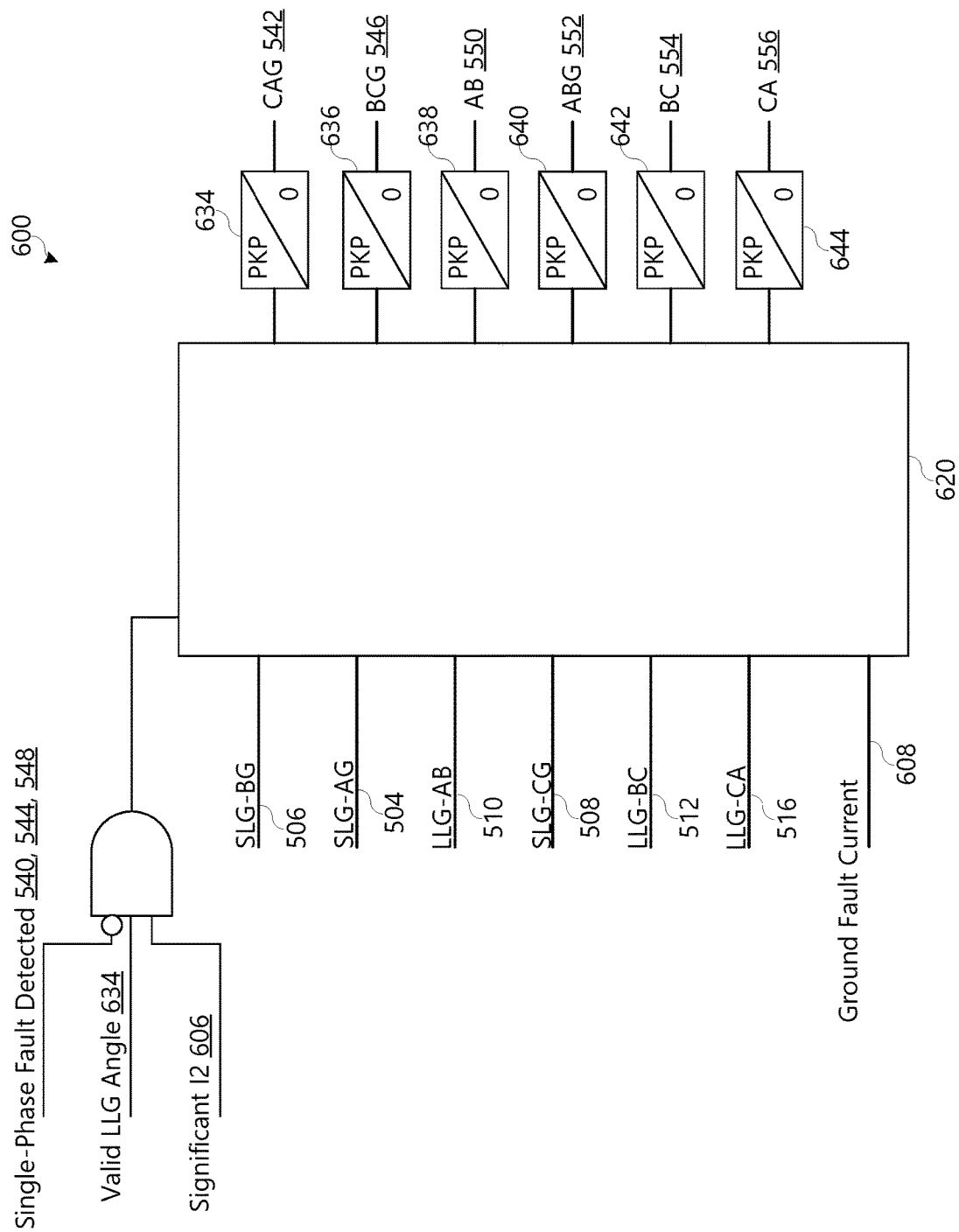
FIG. 6 illustrates a conditioning logic for multiple-line fault type identification.

FIG. 6 illustrates simplified logic 600 for distinguishing line-to-line and line-to-line-to-ground faults using the preliminary single-line-to-ground fault signals and line-to-line-to-ground fault signals SLG-BG 506, SLG-AG 504, LLG-AB 510, SLG-CG 508 LLG-BC 512, and LLG-CA 516. The logic may include a number of preliminary checks. For example, if any of the final single-line-to-ground fault signals AG 540, BG 544, CG 548 are present (e.g. from FIG. 5), then the logic does not enable the LLG fault-type identification block 620. Another check may require a valid LLG angle 634 (for example, the LLG OK signal asserted). Another check may require that the I0 signal is significant 606. The I0 signal may be significant if it exceeds a predetermined level, which level may be calculated using the nominal current. The LLG fault-type identification block 620 may use a ground fault current signal 608. The ground fault current signal 608 may be the presence of I0 current. In various embodiments, a ground fault current signal 608 is asserted when I0 is significant (e.g. exceeds a threshold) and I0 is greater than I2. The LLG fault-type identification block 620 may determine between LL and LLG faults (AB 550 vs ABG 552; BC 554 vs BCG 546; and CA 556 vs CAG 542) according to Table 1. To add further security, pickup timers 634-644 may be used to ensure proper operation under transient conditions and coordination with SLG fault determination. The pickup time may be longer than the SLG fault timers 534, 536, 538, and may be on the order of 4 ms. This allows for priority for single-line-to-ground fault indication and preserves accuracy for single pole tripping.

Figure 7:
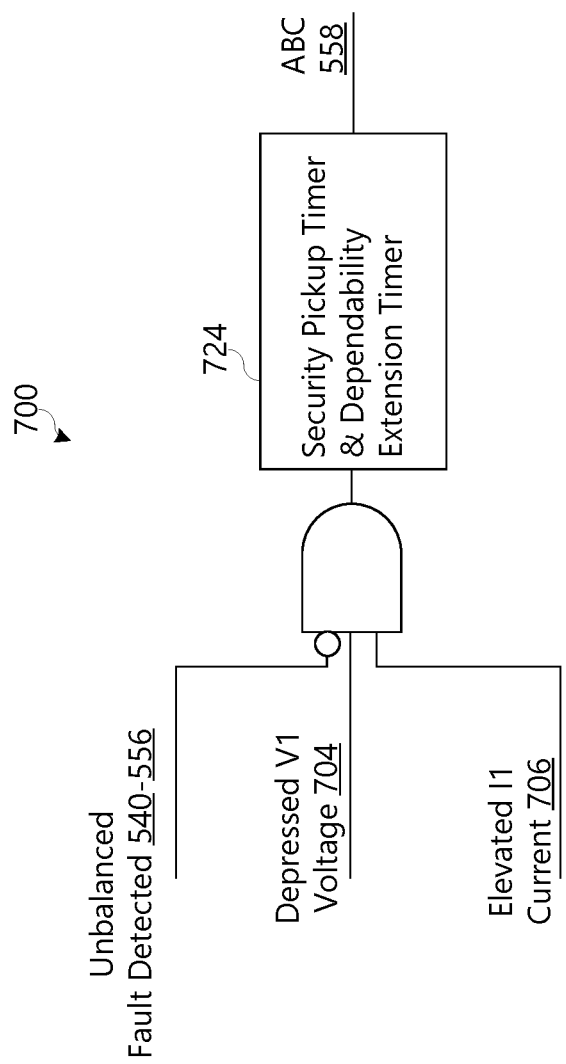
FIG. 7 illustrates a three-phase fault type identification logic.

FIG. 7 illustrates simplified logic 700 useful for declaring a three-phase fault ABC 558. When an unbalanced fault 540-556 is not detected, V1 voltage is depressed 704 (e.g. below a threshold that may be calculated using nominal voltage) signifying an abnormal condition, and I1 current is elevated 706 (e.g. exceeds a threshold that may be calculated using nominal current) signifying an abnormal condition, then a three-phase fault ABC 558 may be declared. Logic 700 may include a security pickup timer and/or dependability extension timer 724. The pickup timer may be coordinated with the timers 534-538 of FIG. 5 and 634-644 of FIG. 6 to prioritize single-line-to-ground fault indications over line-to-line or line-to-line-to-ground fault indications, and to deprioritize three-phase fault indications. The pickup timer 724 may use a longer pickup time on the order of 6 ms. The increasing time delays provide priority as described above, and to preserve accuracy of single pole tripping. For example, for an ABG fault it is better to assert AG and then quickly correct to ABG, then for an AG fault to assert ABG and then correct to AG. In the latter case, the ABG indication would result in an incorrect three-phase trip for a SLG fault. The dependability extension timer may preserve the three-phase fault signal 558 during transient conditions.

While specific embodiments and applications of the disclosure have been illustrated and described, it is to be understood that the disclosure is not limited to the precise configurations and components disclosed herein. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system to determine a fault type in an electric power delivery system, comprising:
a signal processor to
obtain phase current and phase voltage signals from the electric power delivery system;
determine voltage phasors and current phasors of phase voltages and phase currents;
determine negative-sequence current from the current phasors, negative-sequence voltage from the voltage phasors, zero-sequence current from the current phasors, zero-sequence voltage from the voltage phasors, and positive-sequence voltage from the voltage phasors;
calculate a negative-sequence composite signal from the negative sequence current and voltage and a line impedance angle; and,
calculate a zero-sequence composite signal from the zero-sequence current and voltage and the line impedance angle;
a single-line-to-ground fault-type detector to:
calculate a single-line-to-ground angle using the negative-sequence composite signal and the zero-sequence composite signal;
determine a preliminary single-line-to-ground fault type;
a multiple-line fault-type detector to:
calculate a multiple-line-to-ground angle using the positive-sequence voltage and the negative-sequence composite signal;
determine a preliminary multiple-line fault type; and,
a fault-type identifier to:
determine a fault type based on the preliminary single-line-to-ground fault type, and the preliminary multiple-line fault type; and
a protective action module to effect a protective action using the determined fault type.

2. The system of claim 1, wherein the negative-sequence composite signal comprises the negative-sequence current shifted by the line impedance angle but not the negative-sequence voltage when a loss-of-potential condition is detected on the electric power delivery system.

3. The system of claim 1, wherein the zero-sequence composite signal comprises the zero-sequence current shifted by the line impedance angle but not the zero-sequence voltage when a loss-of-potential condition is detected on the electric power delivery system.

4. The system of claim 1, wherein when a loss-of-potential condition is not detected on the electric power delivery system:
- a forward negative-sequence composite signal comprises the negative-sequence current shifted by the line impedance angle less the negative-sequence voltage;
- a reverse negative-sequence composite signal comprises the negative-sequence current shifted by the line impedance angle plus the negative-sequence voltage;
- when a magnitude of the forward negative-sequence composite signal is greater than or equal to a magnitude of the reverse negative-sequence composite signal, then the negative-sequence composite signal comprises the forward negative-sequence composite signal and the zero-sequence composite signal comprises the zero-sequence current shifted by the line impedance angle less the zero-sequence voltage; and
- when a magnitude of the forward negative-sequence composite signal is less than a magnitude of the reverse negative-sequence composite signal, then the negative-sequence composite signal comprises the reverse negative-sequence composite signal and the zero-sequence composite signal comprises the zero-sequence current shifted by the line impedance angle plus the zero-sequence voltage.

5. The system of claim 4, wherein the negative-sequence voltage is multiplied by a negative-sequence coefficient and the zero-sequence voltage is multiplied by a zero-sequence coefficient.

6. The system of claim 1, wherein the single-line-to-ground fault-type detector calculates the single-line-to-ground angle as:

$$\text{angle}(S0) - \text{angle}(S2)$$

where:
S0 is the zero-sequence composite signal; and
S2 is the negative-sequence composite signal.

7. The system of claim 1, wherein the multiple-line-to-ground angle is a function of the negative-sequence composite signal and an angle shift.

8. The system of claim 1, wherein the multiple line-to-ground angle is a function of the negative-sequence composite signal and a fault direction.

9. The system of claim 1, wherein the multiple-line fault-type detector calculates the multiple-line-to-ground angle as:

$$\text{angle}\left(\frac{FDIR * V1}{S2}\right) + 45° - Z1ANG$$

where:
FDIR is +1 for forward faults, and −1 for reverse faults;
S2 is the negative-sequence composite signal;
V1 is the positive-sequence voltage; and
Z1ANG is a positive-sequence line impedance angle.

10. The system of claim 1, wherein the single-line-to-ground fault-type detector determines the preliminary single-line-to-ground fault type by comparing the single-line-to-ground angle against predetermined single-line-to-ground fault-type sectors.

11. The system of claim 1, wherein the multiple-line-to-ground fault-type detector determines the preliminary multiple-line-to-ground fault type by comparing the multiple-line-to-ground angle against predetermined multiple-line-to-ground fault-type sectors.

12. The system of claim 1, further comprising a supervisory signal comparator to compare signal magnitudes against predetermined thresholds before determining the fault type.

13. The system of claim 12, wherein the signal magnitudes comprise magnitudes selected from the group consisting of: the positive-sequence voltage, negative-sequence current, zero-sequence current, negative-sequence composite signal, and zero-sequence composite signal.

14. The system of claim 12, wherein the predetermined thresholds comprise absolute thresholds.

15. The system of claim 12, wherein the predetermined thresholds comprise relative thresholds.

16. The system of claim 1, wherein the fault type and faulted phases are determined based on the combination of preliminary single-line-to-ground fault type and the multiple-line-to-ground fault type.

17. The system of claim 1, wherein the system further comprises a monitored equipment interface configured to signal protective equipment to open a faulted phase of the electric power delivery system based on the determined fault type.

18. A method to determine a fault type in an electric power delivery system, comprising:
- obtaining phase current and phase voltage signals from the electric power delivery system;
- determining voltage phasors and current phasors of the phase voltages and phase currents;
- calculating negative-sequence current from the current phasors, negative-sequence voltage from the voltage phasors, zero-sequence current from the current phasors, zero-sequence voltage from the voltage phasors, and positive-sequence voltage from the voltage phasors;
- calculating a negative-sequence composite signal from the negative sequence current and a line impedance angle;
- calculating a zero-sequence composite signal from the zero-sequence current and the line impedance angle;
- calculating a single-line-to-ground angle using the negative-sequence composite signal and the zero-sequence composite signal;
- determining a preliminary single-line-to-ground fault type;
- calculating a multiple-line-to-ground angle using the positive-sequence voltage and the negative-sequence composite signal;
- determining a preliminary multiple-line fault type; and,
- determining a fault type based on the preliminary single-line-to-ground fault type, and the preliminary multiple-line fault type.

19. A system to determine a fault type in an electric power delivery system, comprising a computer-readable storage medium including instructions that, when executed by a processor, cause the system to:
- obtain current and voltage signals from the electric power delivery system;
- calculate negative-sequence current from the current signals, negative-sequence voltage from the voltage signals, zero-sequence current from the current signals, zero-sequence voltage from the voltage signals, and positive-sequence voltage from the voltage signals;

calculate a negative-sequence composite signal from the negative sequence current and a line impedance angle; and, calculate a zero-sequence composite signal from the zero-sequence current and the line impedance angle;

determine a fault type based on
an angle between the negative-sequence composite signal and the zero-sequence composite signal; and
an angle between the positive-sequence voltage and the negative-sequence composite signal.

20. The system of claim 19, wherein when a loss-of-potential condition is detected on the electric power delivery system:

the negative-sequence composite signal comprises the negative-sequence current shifted by the line impedance angle but not the negative-sequence voltage; and the zero-sequence composite signal comprises the zero-sequence current shifted by the line impedance angle but not the zero-sequence voltage.

\* \* \* \* \*